(12) United States Patent
Yamazoe et al.

(10) Patent No.: US 7,399,558 B2
(45) Date of Patent: Jul. 15, 2008

(54) MASK AND MANUFACTURING METHOD THEREOF AND EXPOSURE METHOD

(75) Inventors: Kenji Yamazoe, Tochigi (JP); Kenji Saitoh, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 798 days.

(21) Appl. No.: 10/896,538

(22) Filed: Jul. 22, 2004

(65) Prior Publication Data

US 2005/0037267 A1 Feb. 17, 2005

(30) Foreign Application Priority Data

Jul. 23, 2003 (JP) ............................. 2003-278046
Jul. 9, 2004 (JP) ............................. 2004-203098

(51) Int. Cl.
*G03F 1/00* (2006.01)
*G03C 5/00* (2006.01)
(52) U.S. Cl. .......................................... 430/5; 430/394
(58) Field of Classification Search .................... 430/5, 430/394, 311–313
See application file for complete search history.

(56) References Cited

U.S. PATENT DOCUMENTS 6,150,059 A * 11/2000 Tanabe et al. ................. 430/5
7,214,453 B2 * 5/2007 Yamazoe et al. ............... 430/5

* cited by examiner

*Primary Examiner*—S. Rosasco
(74) *Attorney, Agent, or Firm*—Morgan & Finnegan, LLP

(57) ABSTRACT

A mask manufacturing method suitable for an exposure method wherein a mask on which a desired pattern and a supplementary pattern with formations smaller than those of the desired pattern are arrayed is illuminated, and the light which passed through the mask onto a member to be exposed is projected via a projection optical system, said method comprising a selecting step for selecting one of the following three supplementary patterns, a first supplementary pattern wherein said supplementary pattern is disposed at a position where a line extending in the vertical direction as to the pitch direction from a certain desired pattern hole of said desired pattern, and a line connecting the supplementary pattern hole closest to said certain desired pattern hole in the vertical direction with said certain desired pattern hole, intersect at an angle of 0°, a second supplementary pattern wherein said angle is 0° or more but less than 45°, and a third supplementary pattern wherein said supplementary pattern supplementary pattern is disposed at a position where said is disposed at a position where said angle is 45°.

7 Claims, 18 Drawing Sheets

| k1 AS TO A HALF PITCH | REMARKS | NORMAL ARRAY | OFFSET ARRAY | DIAGONAL ARRAY |
|---|---|---|---|---|
| 0.25~0.32 | ONLY NORMAL ARRAY HAS NORMAL RESOLUTION PATTERN. | ◎ | | |
| 0.32~0.35 | NORMAL ARRAY OR OFFSET ARRAY IS PREFERABLE. BUT OFFSET ARRAY IS MORE LIKELY TO BECOME A ELLIPSE. | ○ | ○ | |
| 0.35~0.38 | OFFSET ARRAY IS PREFERABLE. | ○ | ◎ | |
| 0.38~0.43 | NORMAL ARRAY IS PREFERABLE. | ◎ | | |
| 0.43~0.45 | NORMAL ARRAY OR DIAGONAL ARRAY IS PREFERABLE. | ○ | | ◎ |
| 0.45~0.62 | DIAGONAL ARRAY IS PREFERABLE. BUT UPON k1 BEING GREATER THAN 0.6, NORMAL ARRAY WITH A HALF PITCH GRADUALLY BRINGS OUT PERFORMANCE THEREOF. | | | ◎ |
| 0.62~0.65 | NORMAL ARRAY WITH A HALF PITCH IS PREFERABLE. | ◎ | | |

FIG. 12

| | BEST FOCUS | DEFOCUS 0.10 μm | DEFOCUS 0.20 μm | DEFOCUS 0.30 μm |
|---|---|---|---|---|
| NORMAL ARRAY | ◻ ◻ ◻ ◻ ◻ | ◻ ◻ ◻ ◻ ◻ | ▦ ▦ ▦ ▦ ▦ | ▣ ▣ ▣ ▣ ▣ |
| DIAGONAL ARRAY | ◉ ◉ ◉ ◉ ◉ | ◉ ◉ ◉ ◉ ◉ | ◉ ◎ ◎ ◎ ◉ | ⋄ ◎ ◎ ◎ ⋄ |
| OFFSET ARRAY | ◻ ◻ ◻ ◻ ◻ | ◻ ◻ ◻ ◻ ◻ | ▦ ▦ ▦ ▦ ▦ | ▣ ▣ ▣ ▣ ▣ |

FIG. 13

MASK AND MANUFACTURING METHOD THEREOF AND EXPOSURE METHOD

This application claims a benefit of a foreign priority based on Japanese Patent Application No. 2003-278046, filed on Jul. 23, 2003, which is hereby incorporated by reference herein in its entirety as if fully set forth herein.

BACKGROUND OF THE INVENTION

The present invention generally relates to exposure, and particularly relates to: a mask employed in the manufacturing of various types of devices including semiconductor chips such as ICs, LSIs, and so forth, display devices such as liquid crystal panels and so forth, detecting devices such as magnetic heads and so forth, image-taking devices such as CCDs and so forth, micro-mechanics, the manufacturing method of the mask; and an exposure method. Here, micro-mechanics means a machine system in the order of microns having advanced features and techniques to manufacture such a system, applying semiconductor integrated circuit manufacturing techniques to the manufacturing of fine structures.

In the event of manufacturing a device using photolithography techniques, projection exposure apparatuses for projecting a pattern drawn on a mask (rectile) onto a wafer using a projection optical system and transferring the pattern, have been conventionally employed.

Mask patterns include adjacent and periodic line-and-space patterns, adjacent and periodic (that is, arrayed with the same interval as with hole diameters) rows of contact holes, isolated contact holes, other isolated patterns, and so forth. In order to transfer patterns with high resolution, there is the need to select the most appropriate exposure conditions (illumination conditions, exposure dose, and so forth) according to the type of employed patterns.

The resolution R of a projection exposure apparatus is obtained by the following Rayleigh's expression, using wavelength λ of light source and numerical aperture NA of a projection optical system.

$$R = k_1(\lambda/NA)$$

Wherein $k_1$ denotes a constant specified by a developing process or the like, and is around 0.5 and 0.7 in the case of normal exposure. From a different point of view, this expression indicates that the pattern size to be resolved can be standardized by (λ/NA) and converted by $k_1$.

Miniaturization of patterns to be transferred, that is, increased resolution, has been increasingly required so as to respond to highly integrated devices in recent years. In order to obtain high resolution, it is effective to increase the numerical aperture NA in the Expression and to reduce the wavelength λ, however, such improvements have reached the limit as for now, so it is difficult to form a pattern below 0.15 μm on a wafer with normal exposure.

Accordingly, improvement of masks as a means for improving imaging characteristics of projection exposure apparatuses has been proposed. For example, there is a halftone mask for improving depth of focus as to an isolated contact hole. The halftone mask is a mask for attenuating light intensity on a portion corresponding to a light-shielding portion of a binary mask, and also keeping a phase difference of 180° as to a light-transmitting portion.

Alternatively, there is a phase shift mask for markedly improving resolution. The phase shift mask is a mask designed to have mutually constant phase differences in the event of incident light toward the mask passing through a light-transmitting portion In general, this phase difference is designed to be 180°. Various kinds of phase shift masks have been proposed, and approximately a half-line width can be realized as to binary masks, depending on the kind of the phase shift mask. This can be achieved by maintaining the mutual phase difference of adjacent light at 180° and mutually counteracting the amplitude of the center portions thereof.

As described above, various proposals have been made in order to form fine patterns, however, it is still extremely difficult to form fine contact hole patterns. Nowadays, the formation of fine contact hole patterns close to the resolution limit has been being studied using binary masks or halftone masks instead of phase shift masks, which are difficult to manufacture and inspect.

The present inventors and others have succeeded in exposing fine contact hole patterns onto a member being exposed, such as a wafer or the like, by disposing a supplementary pattern around the desired pattern of a binary mask and performing special oblique illumination. The supplementary pattern holes are smaller than those of the desired pattern to the extent that resolution is not affected (see the specification in USP Application Laid-Open No. 2002/0177048, for example).

However, arraying of the most appropriate supplementary pattern as to the desired pattern varies depending on the hole diameter and the pitch of the desired pattern, plus, an arraying method for the most appropriate supplementary pattern as to the desired pattern has not been fully known. Accordingly, exposure with the most appropriate supplementary pattern has not been able to be performed, leading to the problem that high resolution could not be obtained in all cases.

Alternatively, it is possible to obtain an array of the most appropriate supplementary pattern by actually performing exposure while changing. the array of the supplementary pattern, however, this takes great amounts of time, resulting in increased developing costs.

SUMMARY OF THE INVENTION

In order to solve the foregoing problems, it is an object of the present invention to provide a mask capable of exposing patterns having one or more holes with a fine hole diameter (for example, 0.15 μm or less) by high resolution the manufacturing method of the mask, and an exposure method.

To this end, according to a first aspect of the present invention, a mask manufacturing method suitable for an exposure method wherein a mask on which a desired pattern and a supplementary pattern with formations smaller. than those of the desired pattern are arrayed is illuminated, and the light which passed through the mask onto a member to be exposed is projected via a projection optical system, said method comprising: a selecting step for selecting one of the following three supplementary patterns; a first supplementary pattern wherein said supplementary pattern is disposed at a position where a line extending in the vertical direction as to the pitch direction from a certain desired pattern hole of said desired pattern, and a line connecting the supplementary pattern hole closest to said certain desired pattern hole in the vertical direction with said certain desired pattern hole, intersect at an angle of 0°; a second supplementary pattern wherein said supplementary pattern is disposed at a position where said angle is 0° or more but less than 45°; and a third supplementary pattern wherein said supplementary pattern is disposed at a position where said angle is 45°.

According to a second aspect of the present invention, with a mask manufacturing method, wherein said desired pattern and said supplementary pattern with formations smaller in size than those of the desired pattern are arrayed on a mask, and wherein an intersection angle, made up of a line extending in a vertical direction as to the pitch direction from a certain desired pattern hole of said desired pattern, and a line connecting the supplementary pattern hole closest to the certain desired pattern hole in said vertical direction with said certain desired pattern hole, is set based on the pitch of said desired pattern.

According to another aspect of the present invention, a mask is manufactured with one of the above manufacturing methods.

According to another aspect of the present invention, a mask designing method suitable for an exposure method wherein a mask on which a desired pattern and a supplementary pattern with formations smaller than those of the desired pattern are arrayed is illuminated, and the light which passed through the mask onto a member to be exposed is projected via a projection optical system, said method comprising: a selecting step for selecting one of the following three supplementary patterns; a first supplementary pattern wherein said supplementary pattern is disposed at a position where a line extending in the vertical direction as to the pitch direction from a certain desired pattern hole of said desired pattern, and a line connecting the supplementary pattern hole closest to said certain desired pattern hole in the vertical direction with said certain desired pattern hole, intersect at an angle of 0°; a second supplementary pattern wherein said supplementary pattern is disposed at a position where said angle is 0° or more but less than 45°; and a third supplementary pattern wherein said supplementary pattern is disposed at a position where said angle is 45°.

According to another aspect of the present invention, a mask designing method suitable for designing a mask on which a desired pattern and a supplementary pattern with formations smaller than those of the desired pattern are arrayed, said method comprising: a setting step for setting an angle between a line extending in the vertical direction as to the pitch direction from a certain desired pattern hole of said desired pattern, and a line connecting the supplementary pattern hole closest to said certain desired pattern hole in the vertical direction with said certain desired pattern hole based on pitch of the desired pattern.

According to another aspect of the present invention, a program for executing any one of the above designing methods.

According to another aspect of the present invention, an exposure method for exposing a member to be exposed with a desired pattern by illuminating a mask manufactured by said above manufacturing method so that said desired pattern is resolved and said supplementary pattern is prevented from being resolved, and projecting the light passing through said mask onto said member to be exposed via a projection optical system.

According to another aspect of the present invention, an exposure method for exposing a member to be exposed with a desired pattern by illuminating a mask manufactured by said above manufacturing method so that said desired pattern is resolved and said supplementary pattern is prevented from being resolved, and projecting the light passing through said mask onto said member to be exposed via a projection optical system.

According to another aspect of the present invention, a mask comprising: an isolated contact hole pattern; and plural supplementary patterns with a size being smaller than that of said isolated contact hole pattern, wherein said plural supplementary patterns are arrayed so as to substantially form the shape of a hexagon around said isolated contact hole pattern as a center.

According to another aspect of the present invention, a mask which arrays an desired contact hole pattern and a supplementary pattern with a size being smaller than that of said desired contact hole pattern, wherein said mask arrays said supplementary pattern at a position intersecting the diagonal line of a quadrangle which has apexes as each center of four desired contact hole patterns.

Further objects, features and advantages of the present invention will become apparent from the following description of the preferred embodiments with reference to the attached drawings.

BRIEF DESCRIPTION OF THE DRAWINGS

FIG. 12 is a table representing relations between $k_1$ of the desired pattern and multiple kinds of supplementary patterns.

FIG. 13 is an aerial image simulation result of two-dimensional intensity distribution at the time of disposing a supplementary pattern of 90 nm as to the desired pattern having a hole diameter of 120 nm and a pattern pitch of 250 nm.

DETAILED DESCRIPTION OF THE PREFERRED EMBODIMENTS

The following description will be made regarding embodiments of the present invention with reference to the attached drawings. Hereafter, the exposure apparatus is assumed to be a reduction exposure apparatus having a light source from a KrF excimer laser (exposure wavelength $\lambda$ =248 nm), a numerical aperture NA of 0.73 of a projection optical system, and a reduction ratio of 4:1 unless otherwise noted. The projection exposure apparatus is generally a reduction projection exposure. In the case of reduction projection exposure, the desired pattern size to be formed differs from the size of the mask pattern by the degree of magnification depending on the exposure apparatus. The magnification of the exposure apparatus varies from one model to another; so, hereafter the pattern size on a mask will be converted to the size on a wafer. For example, in the case that magnification of the projection exposure apparatus is 0.25 times when forming a pattern of 120 nm, a pattern of 480 nm should be formed on the mask, and in the case that magnification of the projection exposure apparatus is 0.20 times, a pattern of 600 nm should be formed on the mask. In order to eliminate the need to distinguish these differences, hereafter, the size of the mask pattern will be converted to the size on a wafer, and referred to as a "120 nm pattern". Alternatively, though each pattern is configured for one or more contact holes, the term "pattern" as used in the present application sometimes denotes a part of a pattern or one contact hole.

As mentioned earlier, the present inventors have already succeeded in exposing fine contact hole patterns by illuminating the mask on which the desired pattern and the supplementary pattern are formed with illumination light of increased resolution to resolve the desired pattern, and with illumination light of reduced resolution to prevent the supplementary pattern from being resolved. In one example, let us say that there is the desired pattern 34 shown in FIG. 2C, and the hole diameter of the desired pattern 34 is 110 nm with the minimal hole interval also being 110 nm.

Figure 2A:
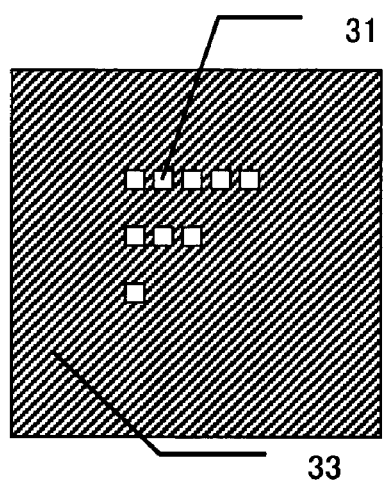
FIG. 2A is a schematic plane view of a normal mask.

In the case of employing the foregoing exposure apparatus, using a mask on which light-transmitting portions (the desired pattern) 31 and light-shielding portions 33 are disposed according to the desired pattern 34 as schematically shown in FIG. 2A, upon the mask being illuminated with illumination having an effective light source of circular shaped illumination distribution, a wafer is exposed, however, the pattern is not resolved in this method. Conversely, exposing a wafer using the mask on which fine light-transmitting portions (supplementary pattern) 32 are disposed on the light-shielding portions 33 around the light-transmitting portions 31 as to the desired pattern 34 as schematically shown in FIG. 2B, and an illumination system in an effective light source shape having cross-shaped light-shielding portions 42 as shown in FIG. 3A, resulted in the pattern being resolved by this method.

Figure 2B:
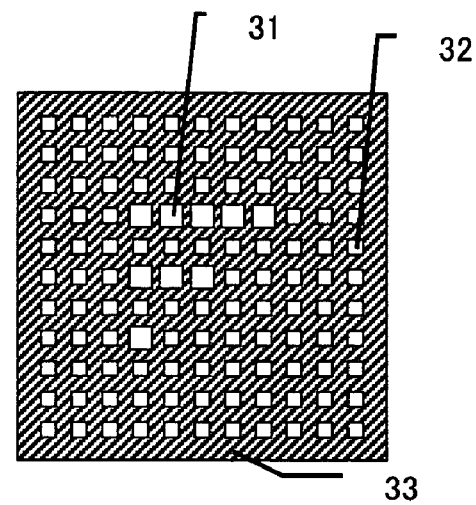
FIGS. 2B and 2D are schematic plane views of a mask used for an exposure method according to the present invention.
Figure 2C:
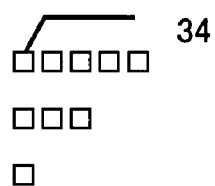
FIG. 2C is a diagram illustrating desired contact hole patterns.

The mask shown in FIG. 2B is a binary mask including the desired pattern 31 and supplementary pattern 32 which are disposed with a pitch in vertical and horizontal directions having a size smaller than the desired pattern 31, so small, that they are not resolved. In FIG. 3A, the white portion on a colored background indicates light-transmitting portions 41, and the solid portion indicates light-shielding portions 42.

This exposure method is a method wherein a mask on which a desired contact hole pattern and a dummy contact hole pattern having a smaller hole diameter than that of the desired pattern disposed is formed, and only the desired contact hole pattern is resolved (This exposure method will be occasionally referred to as Exposure Method I in the present application). The present inventors have also confirmed that the same results have been obtained using the illumination shown in FIGS. 3B through 3F as effective light source shapes in the Exposure Method I.

Figure 3A:
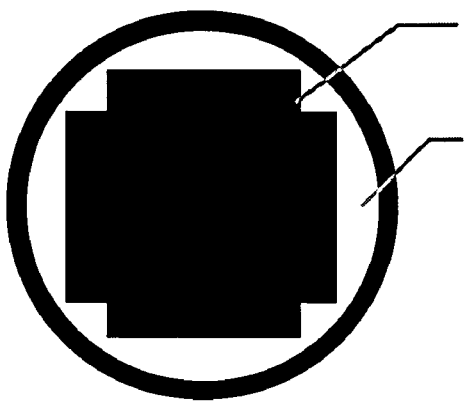
FIGS. 3A through 3F are diagrams illustrating effective light source shapes of an illumination system applicable to the exposure method according to the present invention.
Figure 3B:
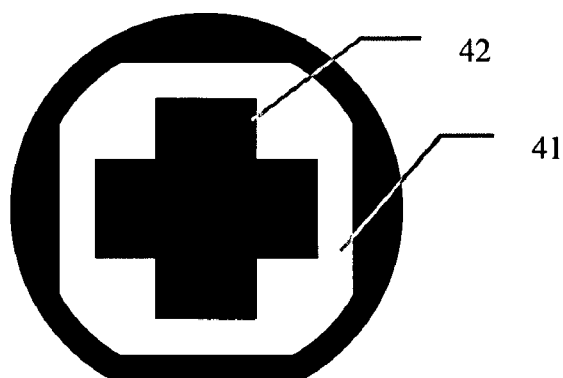
Figure 7:
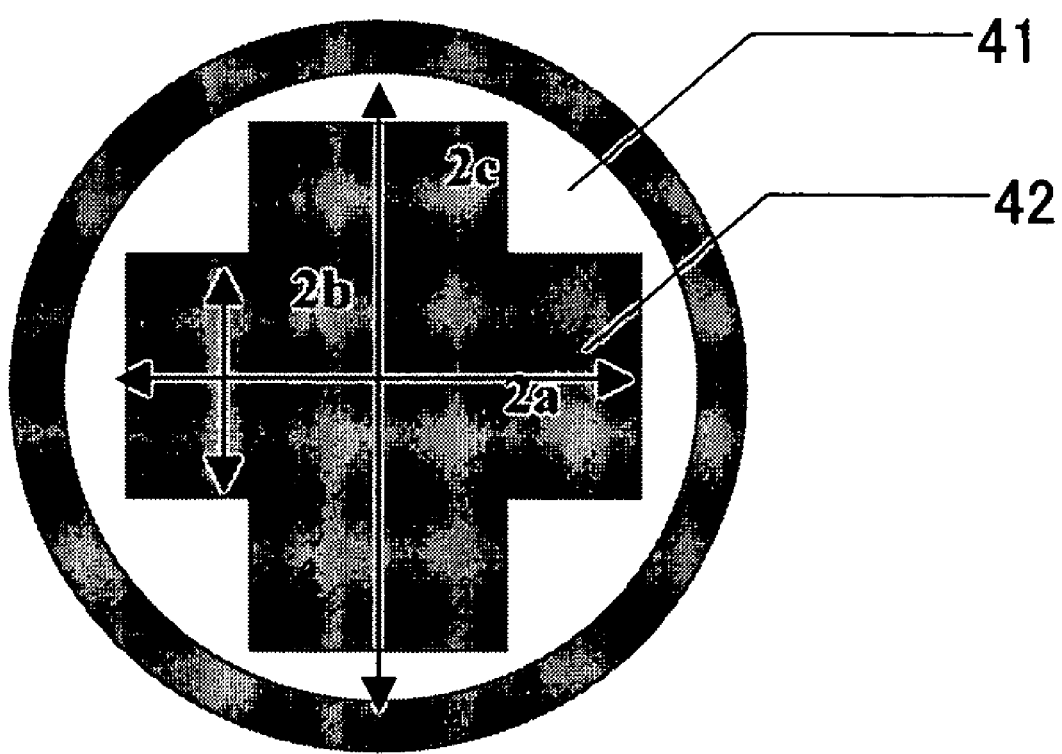
FIG. 7 is a schematic plane view illustrating an effective light source shape used in the event of obtaining the results of FIGS. 6A through 6C.

The effective light source shape shown in FIG. 3B becomes a shape like part of the light-transmitting portions 41 corresponding to the light-shielding portions 42 being cut into a general square shape in the effective light source shape shown in FIG. 3A. More specifically representing the effective light source shape shown in FIG. 3B, upon the size of the effective light source shape shown in FIG. 3A being regulated as shown in FIG. 7, a shape which is cut into a general square shape of 2a or more but 2c at maximum, shown in FIG. 3A, is formed. The effective light source shape shown in FIG. 3A is suitable in the event that the desired contact hole pattern has a fine pitch, and the effective light source shape shown in FIG. 3B is suitable in the event that the desired contact hole pattern has a rough pitch.

Figure 3C:
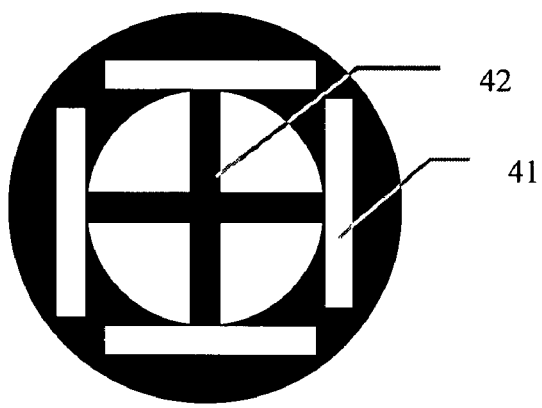
Figure 3D:
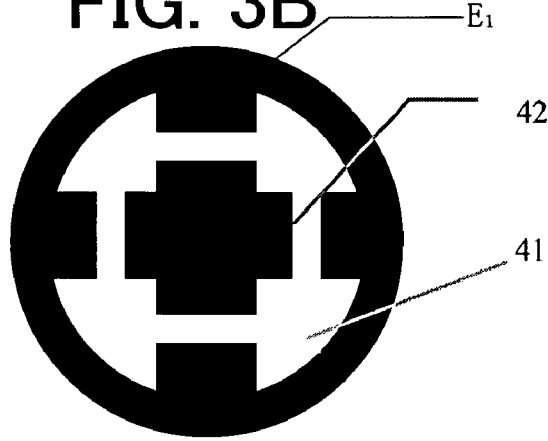
Figure 3E:
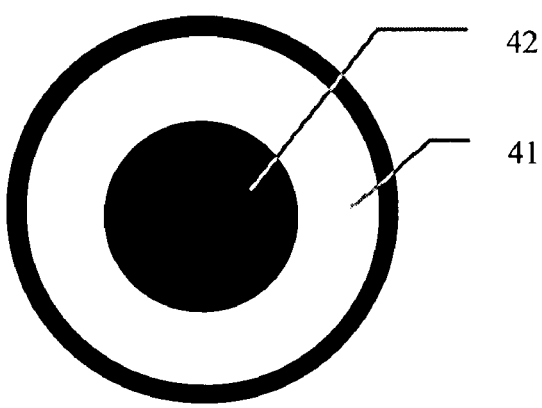
Figure 3F:
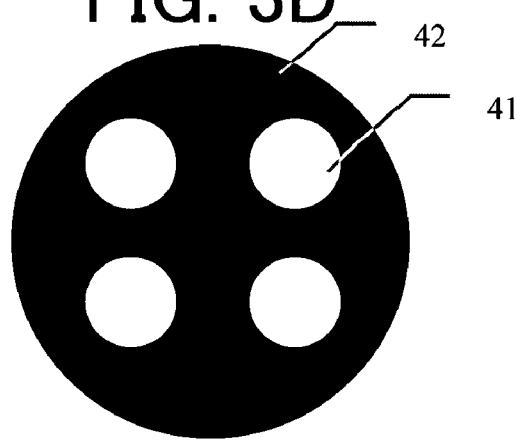

Description will be made regarding the effective light source shape shown in FIG. 3D. First of all, in the event of the size of the effective light. source shape shown in FIG. 3A being regulated as shown in FIG. 7, upon "a" being set to "c" or more, the effective light source is divided into 4 portions. Moreover, a quadrangle with a width of c-b or less and height of 2b is disposed at a position where the center of the quadrangle has an x coordinate between b and c, a y coordinate of 0, and a quadrangle with a width of 2b and height of below c-b is disposed at a position where the center of the quadrangle has a x coordinate of 0 and a y coordinate between b and c, thereby forming the quadrangle as a light-transmitting region. Thus, FIG. 3C can be defined in the same manner. FIG. 3C is a generalization of FIG. 3D. In the case of FIG. 3C, in the event of the size of the effective light source shape shown in FIG. 3C being regulated as shown in FIG. 7, upon "a" being set to "c" or more, the effective light source is divided into four portions. Furthermore, the quadrangle with appropriate width and height is disposed so that the center thereof has (d, 0) as a coordinate, and the quadrangle that is rotated 90° is disposed so that the center thereof has (0, d) as a coordinate, thereby forming the quadrangle as a light-transmitting region. The effective light source shape shown in FIG. 3E is an annular illumination, the effective light source shape shown in FIG. 3F is a quadrupole illumination, and using an illumination having a dark center portion is effective for a mask on which the supplementary pattern is arrayed.

Figure 2D:
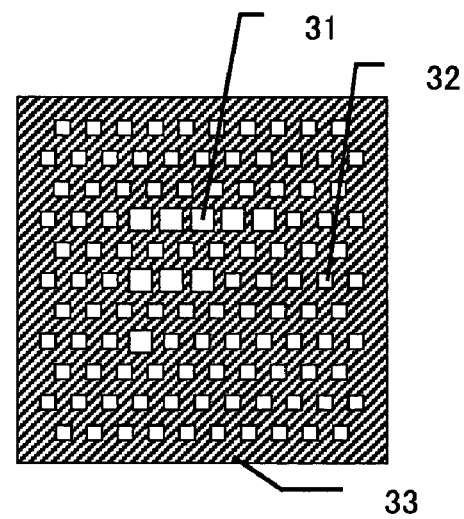

Furthermore, the present inventors have discovered that the desired pattern resolves even in the event of the supplementary pattern being disposed not in vertical and horizontal directions as to the desired pattern but in a diagonal direction as to the desired pattern. For example, as shown in FIG. 2D, in the event of the supplementary pattern 32 being disposed on every other line with offset of a half pitch on a mask shown in FIG. 2B, the desired pattern 31 is resolved. In particular, in the event of the hole diameters of the desired pattern being 120 nm with the minimal hole interval being 120 nm, it has been found that imaging characteristics are better than the arraying of the supplementary pattern 32 in the vertical and horizontal directions.

That is to say, some patterns exhibit excellent imaging characteristics in the event of the supplementary pattern being disposed in vertical and horizontal directions, on the contrary, some other patterns exhibit excellent imaging characteristics in the event of the supplementary pattern being disposed in a diagonal direction, so there is a need to dispose supplementary patterns at the most appropriate positions as to the desired pattern. In the present invention, the principle to dispose the supplementary pattern at the most appropriate position will be described with the desired pattern being classified by a pattern pitch. Here, the pitch will be distinguished by converting the half pitch (denoted by HP) to be standardized by ($\lambda$/NA) and be converted by ($k_1$).

Figure 4A:
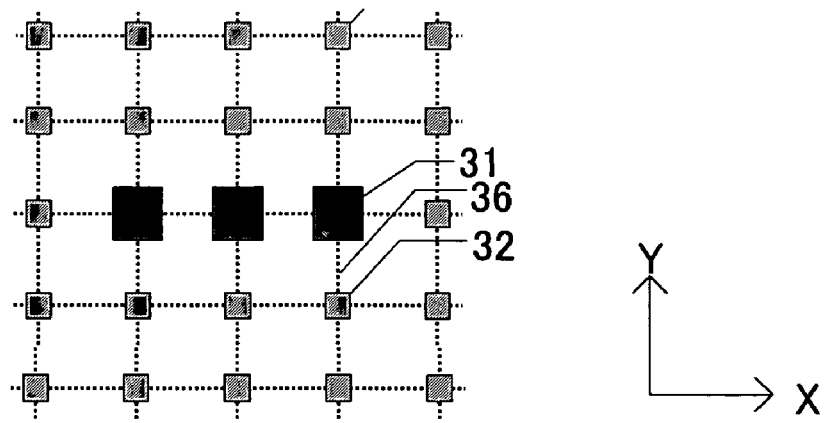
FIGS. 4A through 4C are schematic plane views illustrating mask patterns applicable to the exposure method according to the present invention.

Now, as schematically shown in FIG. 4A, the example of a desired pattern 31 being arrayed in a row, having a pattern pitch in a horizontal direction will be considered. In order to obtain symmetry not only in a vertical direction but also in a horizontal direction, grids 36 are formed in this pattern pitch, on which the supplementary pattern 32 is disposed. In other words, the supplementary pattern 32 is disposed so that a line extending in a vertical direction as to the pitch direction of the desired pattern 31 from the middle hole of the desired pattern 31, and a line connecting the center of the supplementary pattern 32 hole closest to the middle desired pattern hole in a vertical direction thereof with the center of the middle pattern hole, intersect at an angle θ of 0° (first supplementary pattern). In general, the supplementary pattern 32 should be disposed around the desired pattern 31 by two pitches. Such an array of the supplementary pattern 32 will be defined as "normal array".

Figure 4B:
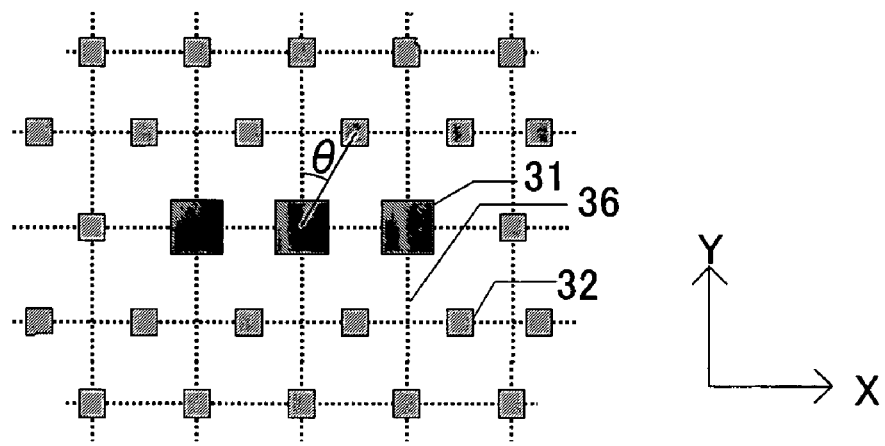

Next, as schematically shown in FIG. 4B, the supplementary pattern 32 on every other line is offset in a horizontal direction by a half pitch from that in a normal array. Such an array of the supplementary pattern 32 will be defined as an "offset array". It is needless to say that an arrangement wherein the supplementary pattern 32 holes on every other column are offset in a vertical direction by a half pitch from that in normal array is also "offset array". In other words, the supplementary pattern 32 is disposed so that a line extending in the vertical direction as to the pitch direction of the desired pattern 31 from the middle hole of the desired pattern 31, and a line connecting between the center of the supplementary pattern 32 hole closest to the middle desired pattern hole in a vertical direction thereof and the center of the middle pattern hole, intersect between an angle θ of 0° to less than 45° (second supplementary pattern).

Figure 4C:
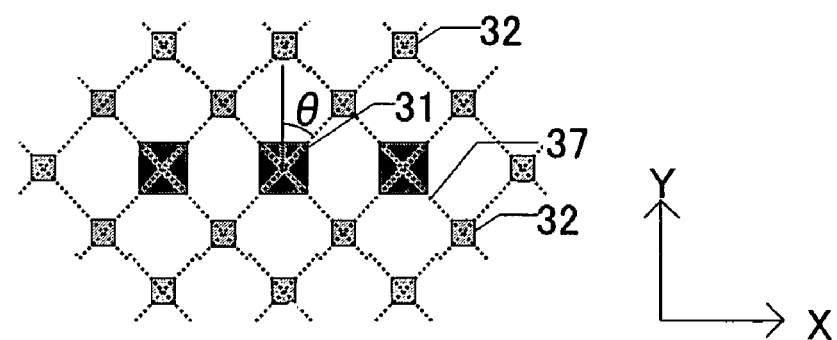

Finally, upon a pattern pitch of the desired pattern 31 reaching a certain degree of size, it is possible to dispose the supplementary pattern 32 onto the grid points of the grids 37, inclining the grids 36 in a normal array by 45°, as schematically shown in FIG. 4C. In other words, the supplementary pattern 32 is disposed so that a line extending in the vertical direction as to the pitch direction of the desired pattern 31 from the middle pattern hole of the desired pattern 31, and a line connecting between the center of the supplementary pattern 32 hole closest to the middle desired pattern hole in a vertical direction thereof and the center of the middle pattern hole, intersect at an angle θ of 45° (third supplementary pattern). Such an array of the supplementary pattern 32 will be defined as "diagonal array".

As described above, though there are three types of arrays for the supplementary pattern 32, the present inventors have identified which array of the supplementary pattern 32 is the most appropriate for a pattern pitch of the desired pattern 31. The results thereof are described below.

Figure 5:
FIG. 5 is a schematic plane view illustrating a desired contact hole pattern.

In the present embodiment, as a pattern on which five contact holes are arrayed will be considered for the desired pattern 31 as shown in FIG. 5. The size of the contact holes is 120 nm, and the pattern pitch is p. The foregoing three types of arrays of the supplementary pattern 32 were compared while changing the value of the pattern pitch p from 220 nm through 440 nm.

Figure 6A:
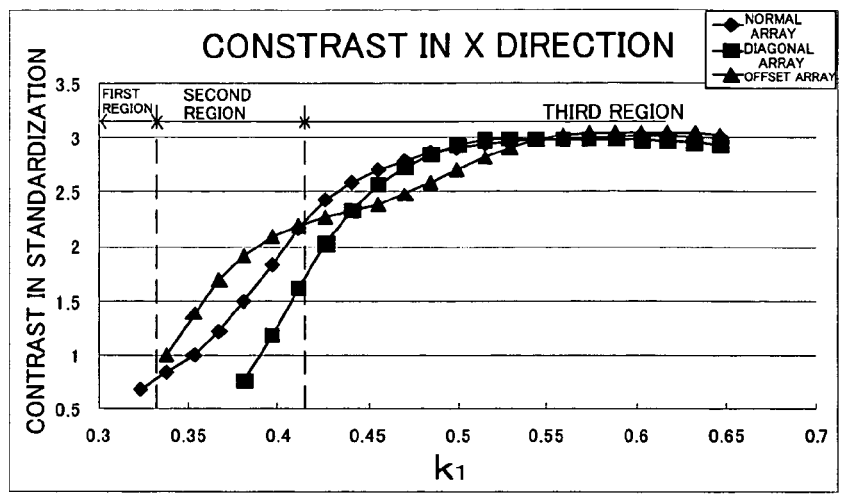
FIGS. 6A through 6C are charts illustrating how imaging characteristics are changed depending on three types of arrays of supplementary patterns in the event of changing the pattern pitch of contact hole pattern shown in FIG. 5.
Figure 6B:
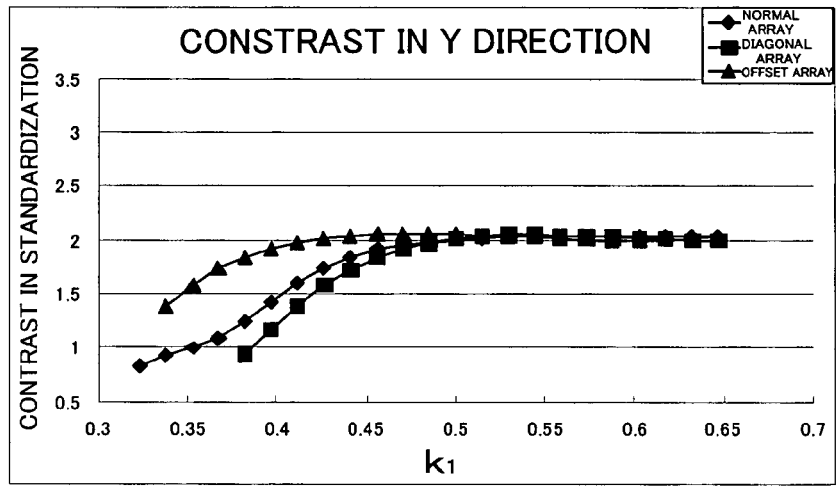

The values compared were contrasted to the depth of focus in the vertical and horizontal directions (x and y directions). The results of comparison of contrast in the vertical and horizontal directions are each shown in FIGS. 6A and 6B. The vertical axes of FIGS. 6A and 6B represent values being standardized in a case of the pattern pitch p in normal array being 240 nm, and the horizontal axes thereof represent converted values obtained by converting a half pitch to $k_1$. More specifically, the vertical axis of FIG. 6A is standardized at 0.32, and the vertical axis of FIG. 6B is standardized at 0.48.

Figure 6C:
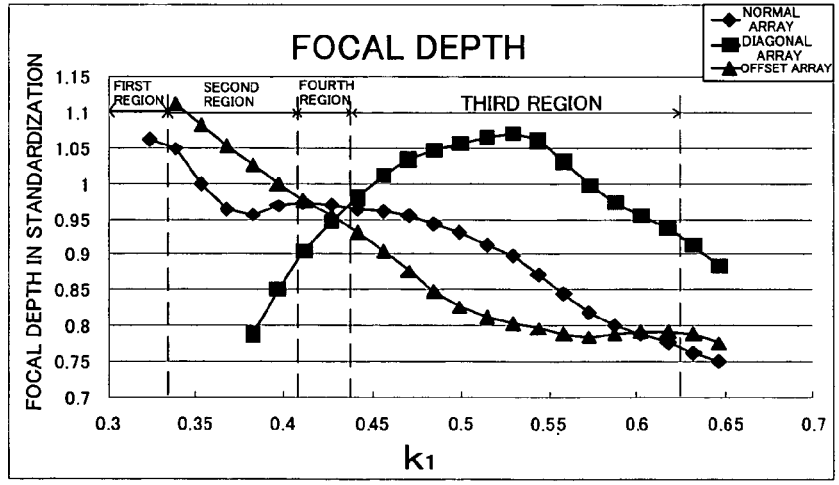

The results of the depth of focus is shown in FIG. 6C. The vertical axis of FIG. 6C, which estimates the depth of focus, represents values standardized in the case of the pattern pitch p in normal array being 240 nm, and the horizontal axis thereof represents converted values obtained by converting the half pitch to $k_1$. More specifically, the vertical axis of FIG. 6C is standardized at 0.31 μm.

The most appropriate array of the supplementary pattern in each pattern pitch of the desired pattern can be understood from the results of FIGS. 6A through 6C. The illumination system employed in the event of obtaining the results of FIGS. 6A through 6C has an effective light source shape of a=0.6 and b=0.5 in the cross-shaped light-shielding portions 42, and c=0.92 in the light-transmitting portions 41 as shown in FIG. 7.

Figure 8:
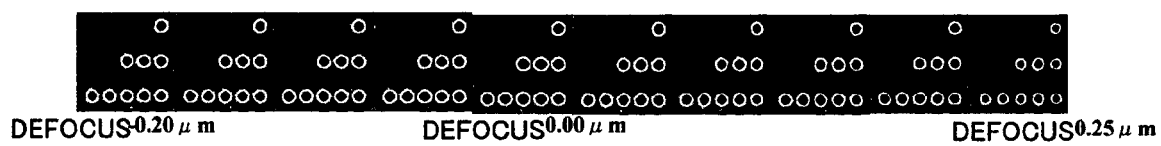
FIG. 8 is the actual experimental result of exposing the contact hole pattern with a pattern pitch of 240 nm with the effective light source shape shown in FIG. 7.

In FIGS. 6A through 6C, the reason that the pattern pitch p of 240 nm is used is that the present inventors have experimentally succeeded in exposure under this condition. The experiment results are shown in FIG. 8. Referring to FIG. 8, it can be understood that a contact hole of 120 nm was resolved in any defocus of 0.20, 0.00, or 0.25 μm. At this time, a silicon substrate serving as a wafer is coated with a bottom anti-reflective coating, and coated with 350 nm of TOK-DP746HC as a resist.

Figure 9A:
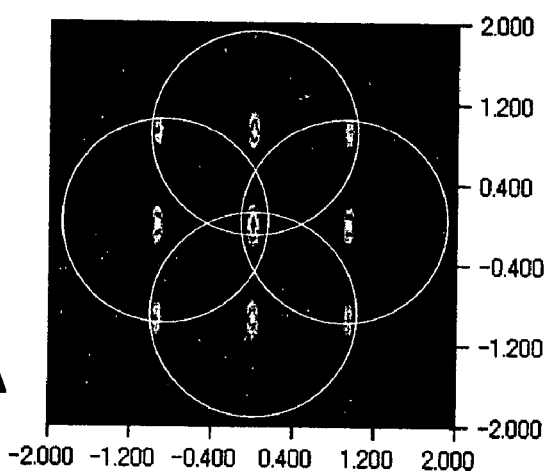
FIGS. 9A through 9C are schematic diagrams illustrating distribution of diffracted light and imaging on surfaces of pupils generated from the mask shown in FIG. 4.
Figure 9B:
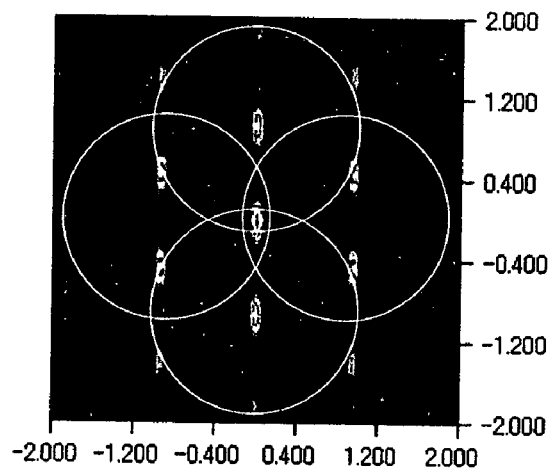
Figure 9C:
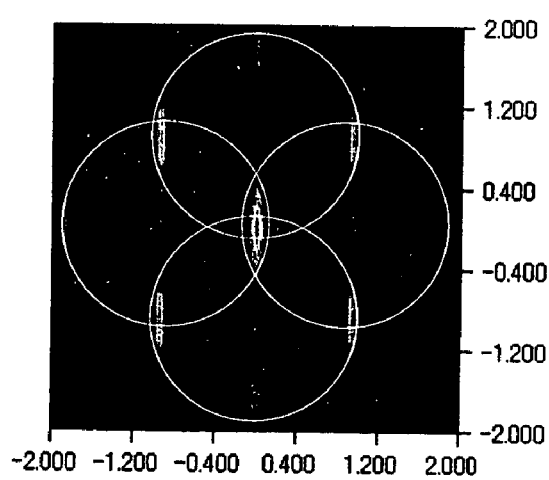

As described above, an optimal array of supplementary patterns according to the pattern pitch of the desired pattern exists, and the reason thereof can be understood from observing diffracted light in the array of each pattern. For example, in the case of a pattern pitch p being 360 nm ($k_1$ converted value of a half pitch is around 0.52) in FIG. 5, diffracted light in the normal array is shown in FIG. 9A, diffracted light for the offset array is shown in FIG. 9B, and diffracted light in a diagonal array is shown in FIG. 9C. The values of the coordinates shown in FIGS. 9A through 9C are standardized with NA/$\lambda$, and the circle with a radius of 1 denotes a pupil. Referring to FIGS. 9A through 9C, upon high-order diffracted light entering pupils, pattern shapes improve, but the depth of focus is reduced. The $k_1$ converted value of a half pitch which is around 0.52 in the case of the pattern pitch p being 360 nm, and at this time, it can be understood from FIG. 6C that the diagonal array has the most appropriate depth of focus, which can be also understood from the distribution of diffracted light in FIGS. 9A through 9C.

In FIG. 9A, it can be understood that the three light flux interference occurs by three kinds of diffracted light entering pupils in a straight line (for example, in the standardized coordinates, diffracted light on (0, 1.9), (0, 0.95) and (0, 0) in a straight line exhibit three light flux interference). Three light flux interference in a straight line is interference dependent on defocus. Similarly, in FIG. 9B, it can be understood that there is three light flux interference in a straight line (for example, in the standardized coordinates, diffracted light on (0, 1.9), (0, 0.95) and (0, 0) in a straight line exhibit three light flux interference). However, in FIG. 9C, there is not three light flux interference but rather two light flux interference. Two light flux interference withstands defocus more than three light flux interference, so a diagonal array has the most appropriate depth of focus with the $k_1$ converted value being around 0.52. However, in the event that the pattern pitch is smaller, a diagonal array cannot be realized. In this case, a normal array and an offset array are compared, with the normal array forming images with less than two light flux interference, and the offset array forming images with less than three light flux interference in a non-straight line. This can be expected since diffracted light occurs in a hexagonal shape in FIG. 9B. In this case, three light flux interference in a non-straight line has a stronger contrast than simple two light flux interference, and, consequently, depth of focus improves. Accordingly, the offset array is preferable in the case of the $k_1$ converted value being around 0.35.

Figure 10:
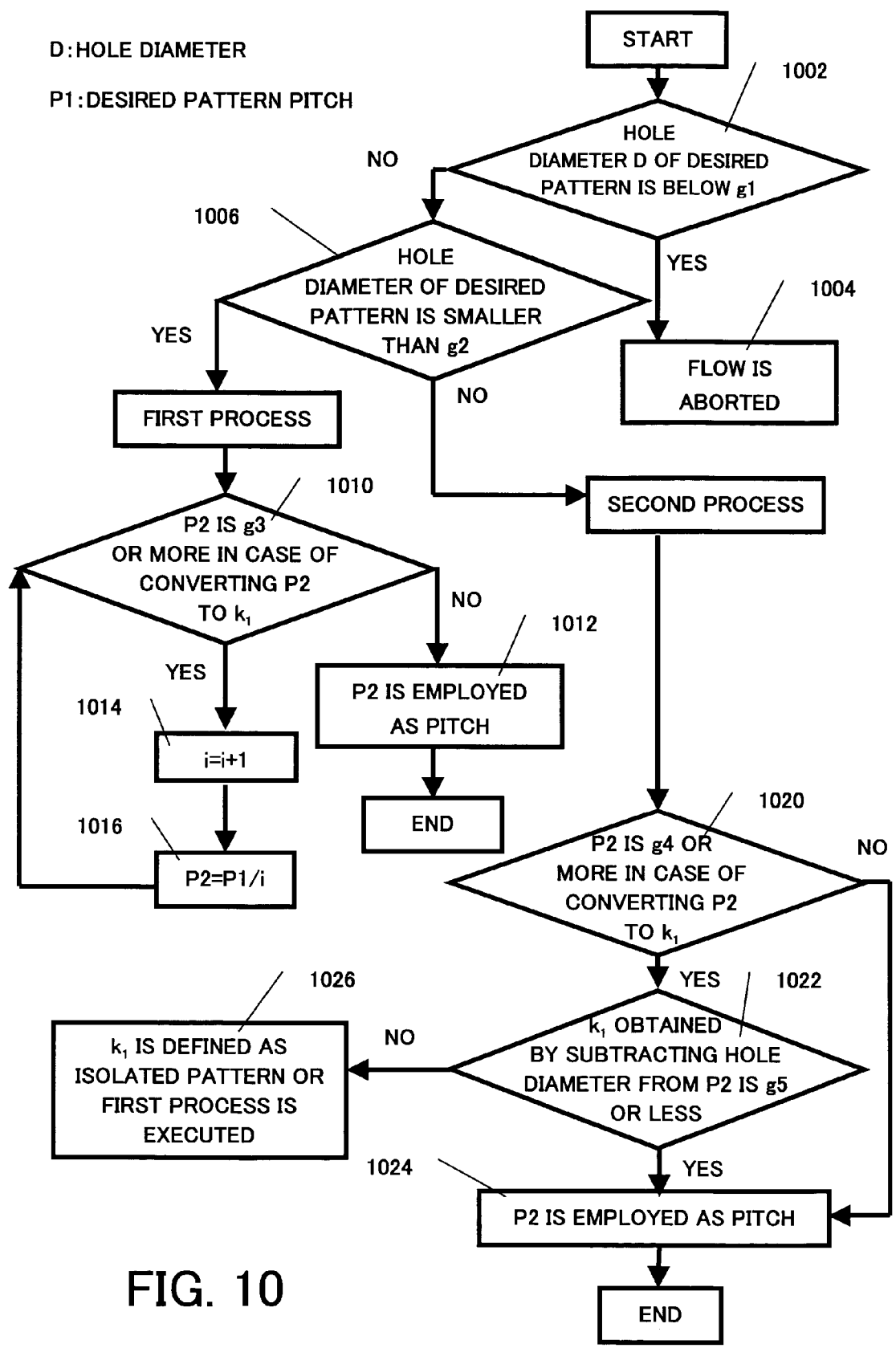
FIG. 10 is a flowchart for describing a determining method of a pattern pitch.

With the present embodiment, the most appropriate array of the supplementary pattern as to the desired pattern of a certain pattern pitch (that is, any one of a normal array, an offset array, or a diagonal array) is apparent. The following description will be made regarding how to determine a pattern pitch with reference to FIG. 10. FIG. 10 is a flowchart for describing a determining method of a pattern pitch.

Figure 18A:
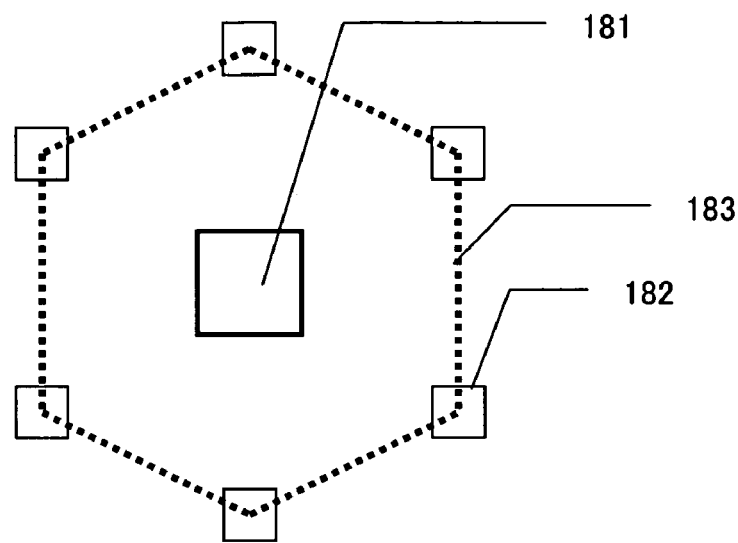
FIG. 18 (FIGS. 18A and 18B) is a view illustrating an array of supplementary patterns in an isolated hole.
Figure 18B:
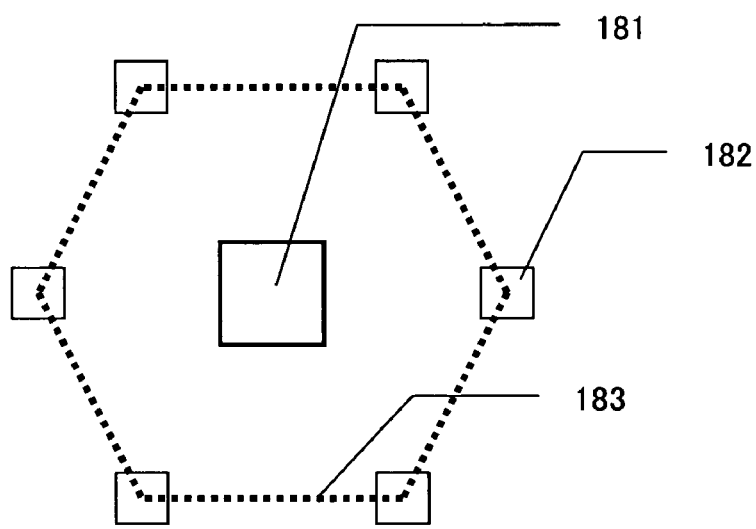

The resolution of projection exposure apparatuses often changes at numerical values 0.25 and $\sqrt{2}$. Accordingly, in FIG. 10, g1, which determines the minimal hole diameter to be resolved, should be set to 0.25 or greater but no more than $0.25 \times \sqrt{2}$, g2, which determines whether or not the normal exposure method can resolve, should be set to $0.25 \times \sqrt{2}$ or more but not more than 0.5, g3, which determines two light flux interference and three light flux interference, should be set to 1.0 or more but not more than $\sqrt{2}$, g4, which determines pattern density, should be set to $0.5 \times \sqrt{2}$ or more but not more than 1.0, and g5, which determines pattern gaps, should be set to 0.25 or more but not more than $0.25 \times \sqrt{2}$. Note that the values g1, g2, g3, g4, and g5 may be 0.29, 0.40, 1.20, 0.80, and 0.25 respectively, for example. An isolated contact pattern should basically be that the half pitch is equal to the hole diameter, and is formed by the same method as the above pitch pattern in a tetragonal lattice. However, when applying a "shifted array" to an isolated pattern, as shown in FIG. 18, it is good to arrange the supplementary patterns 182 so that the supplementary patterns may form a hexagon shaped grid 183 centering on the desired isolated contact hole pattern 181. It is good to arrange the supplementary patterns 182 by determining the hole diameter as (equal to) the half pitch from the desired pattern 181. FIG. 18 (FIG. 18A and 18B) is a view illustrating an array of supplementary patterns in an isolated hole.

First of all, judgment is made whether or not the hole diameter D of the desired pattern is below g1 (Step 1002). In the case of determining Yes (below g1) in Step 1002, the flow is aborted (Step 1004). In the case of determining No (g2 or less) in Step 1002, judgment is made as to whether or not the hole diameter of the desired pattern is smaller than g2 (Step 1006). Here, the desired pattern of the pitch is set as P1, plus, an initial value of the supplementary pattern half pitch is set as P1.

In the case of determining Yes (P1 is smaller than g2) in Step 1006, a first process is executed. The first process executes judgment that is made whether or not P2 is g3 or more in the case of first converting P2 to $k_1$ (Step 1010)

In the case of determining No (below g3) in Step 1010, P2 is employed as the pitch (Step 1012). In the case of determining Yes (g3 or more) in Step 1010, i is incremented by 1 (Step 1014), P2 is substituted with P1/i (Step 1016), and the flow returns to Step 1010. Finally, P2 is employed as the pitch (Step 1012).

In the case of determining No (P1 is not smaller than g2) in Step 1006, a second process is executed. The second process executes judgment that is made whether or not P2 is g4 or more in the case of converting P2 to $k_1$ (Step 1020). In the case of determining Yes (g4 or more) in Step 1020, judgment is made whether or not $k_1$ obtained by subtracting the hole diameter from P2 is g5 or less (Step 1022), and in the case of determining No (above g5), the desired pattern is treated as an isolated pattern or the first process is executed (Step 1026). On the other hand, in the case of determining No (below g4) in Step 1020, or in the case of determining Yes (g5 or less) in Step 1022, P2 is employed as the pitch (Step 1024).

In the event of the desired pattern being arrayed one-dimensionally, a pattern pitch can be obtained from the flowchart shown in FIG. 10. In the event of the desired pattern being arrayed two-dimensionally and the array of the pattern being regulated on quadrangle-shaped grids, essentially each pattern pitch in the vertical and horizontal directions of the desired pattern is obtained, and the most appropriate array of the supplementary pattern suitable for each pattern pitch should be selected.

Figure 11:
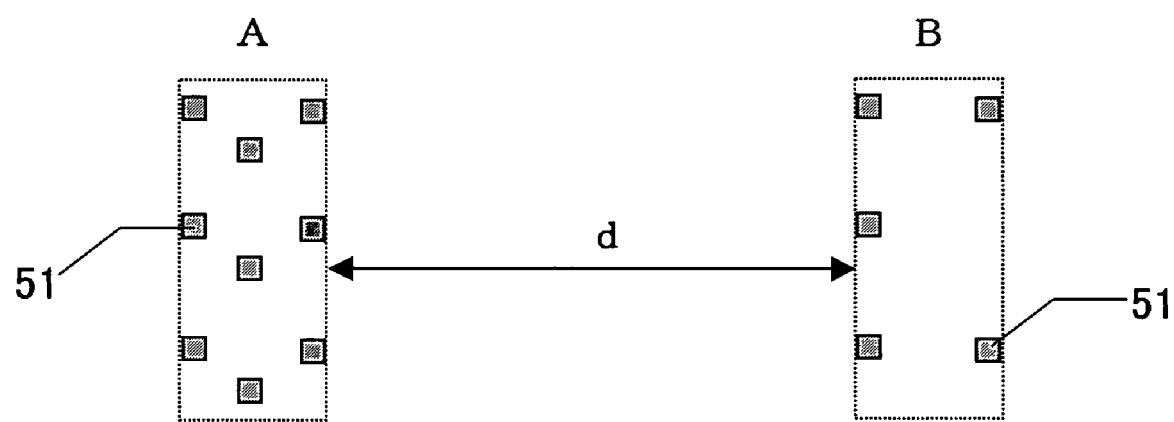
FIG. 11 is a schematic diagram for defining pattern groups of the desired patterns.

Disposing a supplementary pattern around the desired pattern by two pitches or three pitches is sufficient, but one pitch may also achieve the effect. Accordingly, a desired pattern that is distanced from a certain desired pattern by 12 times or more, the hole diameter of the desired pattern, should be considered as a separate desired pattern. For example, as shown in FIG. 11, a pattern having center intervals between adjacent contact holes 51 within 12 times as long as the hole diameter are grouped as pattern group A, and similarly, a pattern group B is defined. FIG. 11 is a schematic drawing to define a pattern group of the desired pattern. At this time, in the case of the interval d between the pattern group A and the pattern group B being 12 times as long as the hole diameter or more, an independent pattern pitch should be obtained for each pattern group.

Though it has been confirmed that one direction's length of a supplementary pattern should be between 50% and 90% of the desired pattern, around 75% is usually sufficient. A supplementary pattern's area may be between 25% and 80%.

This principle can be applied to various patterns, examples of which will become apparent in the following embodiments.

First Embodiment

The results shown in FIGS. 6A through 6C have been studied, and further, a normal array with a half pattern pitch has been considered, whereby the conclusion shown in FIG. 12 can be obtained. In order to confirm whether or not the conclusion shown in FIG. 12 is correct, a pattern with a hole diameter of 120 nm and a pattern pitch p of 250 nm (where, the $k_1$ converted value of a half pitch is equivalent to around 0.37) in FIG. 5 have been considered. Referring to FIG. 12, it is expected that the offset array has the most appropriate imaging characteristics. Aerial images of two-dimensional intensity distribution are shown in FIG. 13 in the case of the size of the supplementary pattern being 90 nm. FIG. 13 illustrates respective cases of best focus, defocus of 0.10 µm, defocus of 0.20 µm, and defocus of 0.30 µm. Referring to FIG. 13, it can be understood that the offset array has the largest depth of focus. Consequently, it can be understood that the conclusion shown in FIG. 12 is correct.

Second Embodiment

Figure 14:
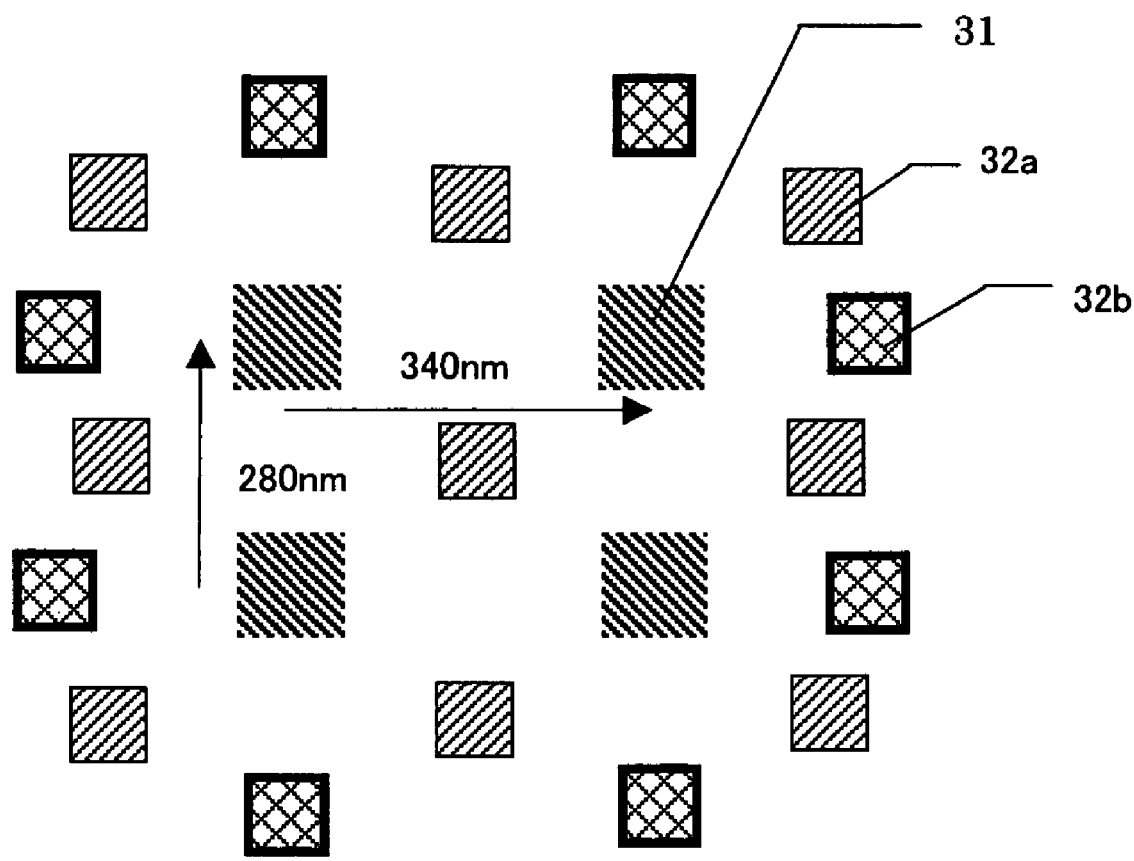
FIG. 14 is a schematic plane view illustrating a mask including multiple kinds of arrays.

While an arrangement wherein supplementary patterns are arrayed in one type of grid pattern as to a given pattern has been proposed in the first embodiment, supplementary patterns arrayed in multiple types of grid patterns may be combined. For example, let us say that there is a desired pattern 31 with a hole diameter of 120 nm, a pattern pitch of 340 nm in a horizontal direction (where the $k_1$ converted value of a half pitch is equivalent to around 0.50), and a pattern pitch of 280 nm in a vertical direction (where the $k_1$ converted value of a half pitch is equivalent to around 0.41) as shown in FIG. 14. Note that FIG. 14 is a schematic plane view illustrating a mask on which multiple kinds of arrays are mixed. First of all, the supplementary pattern 32a is disposed at the center of the desired pattern 31 and around it.

Here, with regard to the supplementary pattern 32a, it can be understood from FIGS. 6A through 6C and FIG. 12 that diagonal array is extremely effective in a case of the $k_1$ converted value being around 0.50, so the supplementary pattern 32a is disposed with a diagonal array. However, it can be also understood from these drawings that the diagonal array is less effective in the case of the $k_1$ converted value being around 0.41. Here, further studying FIGS. 6A through 6C and FIG. 12 show that a normal array in the case of the $k_1$ converted value being around 0.41 exhibits more appropriate imaging characteristics in comparison with a diagonal array in the case of the $k_1$ converted value being around 0.41, and further, a normal array in the case of the $k_1$ converted value being around 0.35 (that is, the pattern pitch being 240 nm, which is twice as long as the hole diameter) exhibits further more appropriate imaging characteristics. Now, taking advantage of properties of supplementary patterns, which can be freely disposed since they are not resolved, the supplementary patterns should be relocated with a normal array with the $k_1$ converted value being around 0.35. In FIG. 14, the supplementary pattern 32b is disposed with a normal array so that the $k_1$ converted value exhibits around 0.35 around the desired pattern 31, thereby improving imaging characteristics. In FIG. 14, the mask includes a plurality of arrangements.

Note that, while a supplementary pattern disposed according to the pattern pitch in the horizontal direction and a supplementary pattern disposed according to the hole diameter have been mixed in this embodiment, a supplementary pattern disposed according to the pattern pitch in the horizontal direction and a supplementary pattern disposed according to the pattern pitch in the vertical direction may be combined as well.

Third Embodiment

Figures 15A, 15B, 15C:
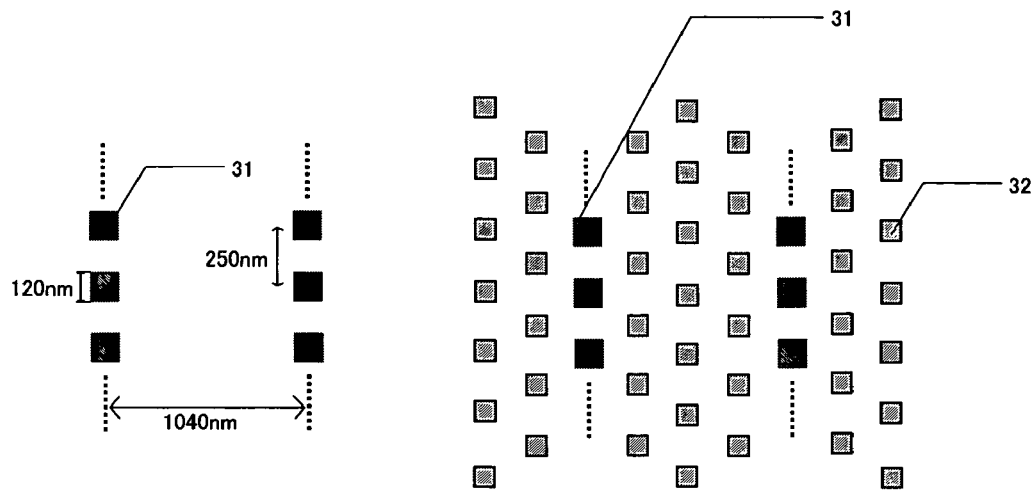
FIGS. 15A and 15B are schematic plane views illustrating the relation of arrays between a desired pattern and supplementary patterns.
FIG. 15C is a diagram illustrating aerial images of two-dimensional intensity distribution for these patterns.

An example of determining a pattern pitch will be described following the flowchart shown in FIG. 10. With the desired pattern 31, 13 holes with a hole diameter of 120 nm and a pattern pitch of 250 nm in a vertical direction (the $k_1$ converted value of a half pitch is equivalent to around 0.37) are arrayed with a hole center distance of 1040 nm in a horizontal direction as shown in FIG. 15A (note that only the three center holes are shown in FIG. 15A). First of all, in the flowchart shown in FIG. 10, the values of g1, g2, g3, g4, and g5 are 0.29, 0.40, 1.20, 0.80, and 0.25 respectively. It can be understood that P2 is 250 nm in a vertical direction (the $k_1$ converted value of a half pitch is around 0.37), and P2 is 260 nm in a horizontal direction (the $k_1$ converted value of a half pitch is around 0.38). The offset array is more appropriate as to these pitches, so the supplementary pattern 32 of 90 nm is disposed as shown in FIG. 15B.

An aerial image of a case with no supplementary pattern 32 was compared with an aerial image in a case of disposing the supplementary pattern 32, and the results of the comparison are shown in FIG. 15C. It can be understood from the drawing that disposing the supplementary pattern 32 improves imaging characteristics immensely.

As described above, it can be understood that appropriately disposing the supplementary pattern according to the pattern pitch of the contact hole patterns enables for example, the manufacturing of a mask capable of exposing patterns having a fine hole diameter of less than 0.15 μm with high resolution. That is to say, setting the most appropriate intersection angle made up of a line extending in a vertical direction as to a pitch direction from a certain contact hole of the contact hole pattern, and a line connecting the center of the supplementary pattern hole closest to the certain contact hole in the vertical direction with the center of the certain contact hole according to the pitch of the contact hole pattern, enables a mask capable of exposing with high resolution to be manufactured. More specifically, the half pitch of a contact hole pattern is converted to $k_1$, represented by the Expression, and the array of the supplementary pattern is selected from the following three patterns based on the converted $k_1$: a first supplementary pattern (that is, a normal array) wherein the supplementary pattern is disposed where an intersecting angle made up of a line extending in the vertical direction as to the pitch direction from the middle hole of the contact hole pattern and a line connecting the supplementary pattern hole closest to the middle contact hole in the vertical direction with the middle contact hole, is 0°; a second supplementary pattern (that is, an offset array) wherein the supplementary pattern is disposed where an intersecting angle made up of a line extending in the vertical direction as to the pitch direction from the middle hole of the contact hole pattern and a line connecting the supplementary pattern hole closest to the middle contact hole in the vertical direction with the middle contact hole, is 0° or more but smaller than 45°; and a third supplementary pattern (a diagonal array) wherein the supplementary pattern is disposed where an intersecting angle made up of a line extending in the vertical direction as to the pitch direction from the middle hole of the contact hole pattern and a line connecting the supplementary pattern hole closest to the middle contact hole in the vertical direction with the middle contact hole, is 45°.

For example, referring to FIGS. 6A and 12, the converted value range of $k_1$ between 0.25 and 0.34 is a first region in the half pitch of the pattern, the converted value range of $k_1$ between 0.34 and 0.42 is a second region, and the converted value range of $k_1$ between 0.42 and 0.62 is a third region, and in the case of the $k_1$ converted value of the desired pattern being included in the range of the first region, the first supplementary pattern is selected, in the case of $k_1$ being included in the range of the second region, the second supplementary pattern is selected, and in the case of the $k_1$ converted value being included in the range of the third region, the third supplementary pattern is selected.

Furthermore, referring to FIG. 6C and FIG. 12, an arrangement may be made wherein the value range of $k_1$ between 0.4 and 0.45 is a fourth region within the second region, and in the case of the $k_1$ converted value of the desired pattern being within the fourth region, the first supplementary pattern may be selected. It is suitable to select the first supplementary pattern in case of the $k_1$ converted value range between 0.25 and 0.32, and the third supplementary pattern in case of the converted value $k_1$ range between 0.45 and 0.62.

Accordingly, the optimal array of the supplementary pattern as to the desired pattern is known, thereby enabling high-resolution exposure to be performed with the optimal supplementary pattern. Moreover, there is no need to perform exposure in order to obtain the optimal array of the supplementary pattern, so developing time can be reduced, resulting in reduced developing costs.

Note that, with the foregoing embodiments, while square contact hole patterns have been shown as the desired pattern, the present invention can be applied to contact hole patterns in other shapes such as rectangles or elongated holes and so forth.

Figure 1:
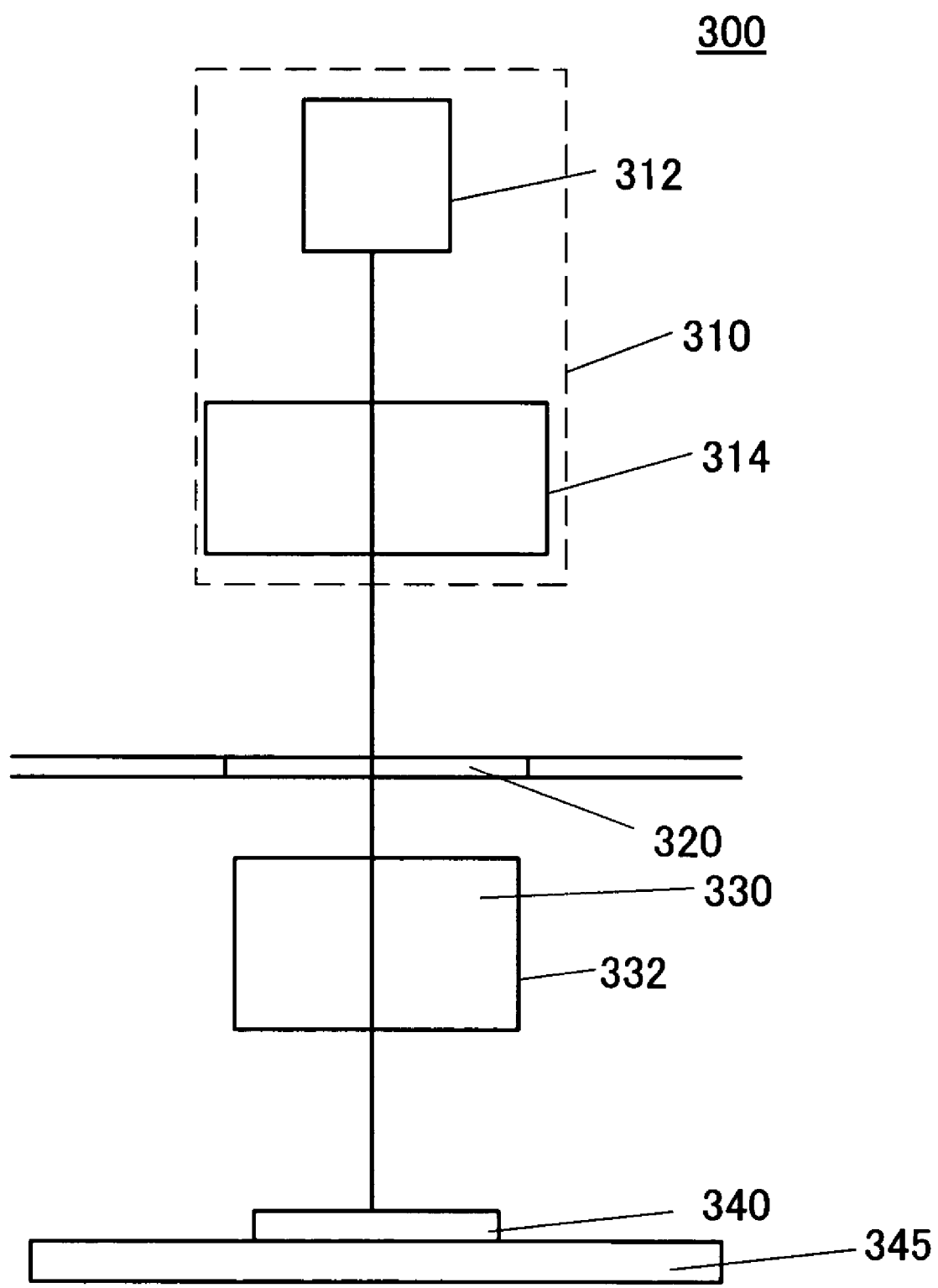
FIG. 1 is an optical path diagram simplifying an exposure apparatus as an embodiment of the present invention.

The following description will be made regarding an exposure apparatus 300 for exposing a mask according to the present invention with reference to FIG. 1. Here, FIG. 1 is a schematic block cross-sectional diagram of an exemplified exposure apparatus 300 according to the present invention. The exposure apparatus 300 comprises an illumination apparatus 310 for illuminating the foregoing mask, a projection optical system 330 for projecting diffracted light generated from the illuminated mask pattern onto a plate 340, and a stage 345 for supporting the plate 340, as shown in FIG. 1.

The exposure apparatus 300 is, for example, a projection exposure apparatus for exposing circuit patterns formed on a mask 320 with a step-and-scan method or step-and-repeat method onto the plate 340. This exposure apparatus is suitable for lithography process in the order of sub-microns, quarter-microns, or less. With the present embodiment, an exposure apparatus with a step-and-scan method (this is also referred to as a scanner) will be described as an example. Note that the step-and-scan method is an exposure method for continuously scanning a wafer, as to a mask, exposing a mask pattern onto the wafer, and step-moving the wafer to the next exposure region following one-shot exposure. The step-and-repeat method is an exposure method for step-moving a wafer to the next exposure region following entire exposure.

The illumination apparatus 310 for illuminating the mask 320 on which circuit patterns for transfer are formed comprises a light source unit 312 and an illumination optical system 314.

The light source unit 312 can employ for example, a light source such as ArF excimer laser with wavelength of 193 nm, KrF excimer laser with wavelength of 248 nm, and F2 laser with wavelength of 157 nm, however, the types and number of light sources are not restricted to these. Moreover, in the case of employing a laser in the light source unit 312, a light flux formation optical system for converting parallel optical flux to a desired beam shape, and an incoherent optical system for converting coherent laser light flux to incoherent laser light flux, are preferably employed.

The illumination optical system 314 is an optical system for illuminating the mask 320 and includes a lens, mirror, light integrator, diaphragm, and so forth. The components are arrayed in the order of, for example, a condensing lens, fly-eye lens, limiting aperture, condensing lens, slit, and an imaging optical system. The illumination optical system 314 can be employed regardless of axial light or extra-axial light. A light integrator includes an integrator that is configured by overlaying the fly-eye lenses or two pairs of cylindrical lens array (or lenticular lenses) plates, and is sometimes replaced by an optical rod or diffraction devices.

The mask 320 is, for example, made up of quartz, on which a circuit pattern (or an image) to be transferred is formed, and is supported and driven by an unshown mask stage. Diffracted light from the mask 320 is projected onto the plate 340 via a projection optical system 330. The mask 320 and the plate 340 have an optically conjugate relationship. The exposure apparatus 300 according to the present embodiment is a scanner, and transfers patterns of the mask 320 onto the plate 340 by scanning the mask 320 and the plate 340 with a speed ratio of a reduced magnification ratio. Note that, in the case of an exposure apparatus using the step-and-repeat method (this is also referred to as a stepper), an exposure is performed in a state where the mask 320 and the plate 340 are stationary. The foregoing desired pattern and supplementary pattern are formed on the mask 320.

As for the projection optical system 330, an optical system made up of multiple lens devices, an optical system having multiple lens devices and at least one concave mirror (a catadioptric optical system), an optical system having multiple lens devices and at least one diffraction optical device such as a chinoform or the like, an all-mirror type optical system, and so forth, can be employed. In the case of achromaticity being required, multiple lens devices made up of glass material having mutually different distributed values are employed, diffraction optical devices are configured so as to generate dispersion in an opposite direction to lens devices, or the like.

The plate 340 is a member being processed such as a wafer, liquid crystal substrate, or the like, with photo-resist coated thereupon. The photo-resist coating process includes pre-processing, adhesion accelerator coating processing, photo-resist coating processing, and pre-bake processing. Pre-processing includes cleaning, drying, and so forth. Adhesion accelerator coating processing is surface improvement processing (that is, hydrophobicity improvement processing with surface coating) for improving adhesion between the photo-resist and base, wherein an organic film such as HMDS (Hexamethyl-disilazane) or the like is coated or vapor-deposed. Pre-bake processing is a baking process softer than that following developing, and removes solvent.

The stage 345 supports the plate 340. The stage 345 is applicable to any known configuration in this industry, so a detailed description regarding configuration and movement thereof will be omitted here. For example, the stage 345 can move the plate in x and y directions with a linear motor. The mask 320 and the plate 340 are, for example, subjected to synchronous scanning. The positions of the stage 345 and an unshown mask stage are monitored with a laser interferometer for example, and the stage 345 and the unshown mask stage are driven with a constant speed ratio. The stage 345 is, for example, disposed on a stage surface plate supported on a floor or the like via a damper. The mask stage and the projection optical system 330 are, for example, disposed on an unshown lens-barrel surface plate supported on a base frame mounted on a floor or the like via a damper or the like.

For exposure, a light flux from the light source unit 312, for example, Koehler illuminates onto the mask 320 with the illumination optical system 314. Light that passes through the mask 320 and bears the mask pattern forms an image on the plate 340 with the projection optical system 330. With the mask 320 which the exposure apparatus 300 employs, the supplementary pattern improves imaging characteristics of the desired pattern (for example, approximates a round shape), and increases the depth of focus, thereby improving workability and providing a high graded device (semiconductor devices, LCD devices, image-taking devices such as CCDs, thin-film magnetic heads, and the like) compared with a conventional device.

Figure 16:
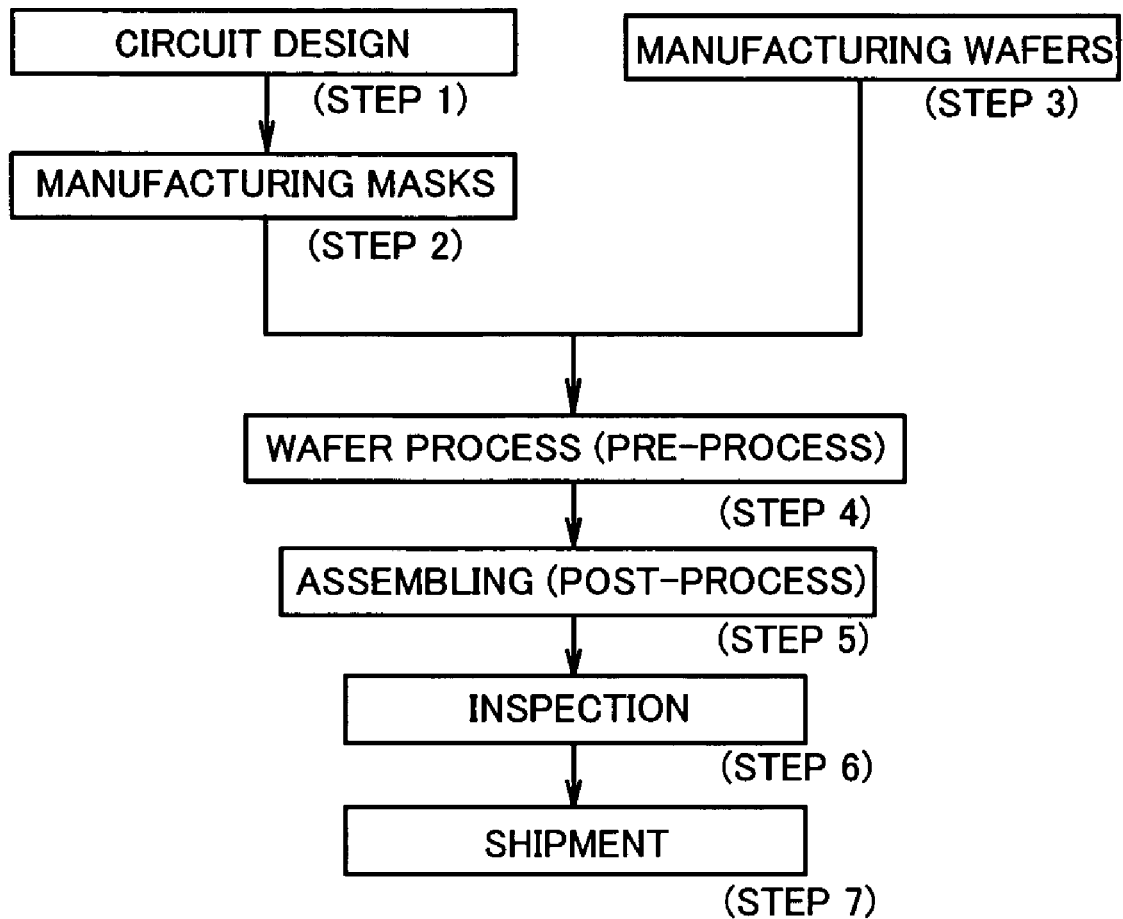
FIG. 16 is a flowchart for describing the manufacturing steps of devices including semiconductor chips such as ICs, LSIs, and so forth, LCDs, CCDs, and so forth.

Next, an embodiment of a device manufacturing method using the foregoing exposure apparatus 300 will be described with reference to FIGS. 16 and 17. FIG. 16 is a flowchart for describing a manufacturing method of devices (semiconductor chips such as ICs, LSIs, and so forth, LCDs, CCDs, and so forth). A manufacturing example of semiconductor chips will be described hereafter. In Step 1 (circuit design), circuit design of devices is performed. In Step 2 (manufacturing masks), a mask suitable for the formation of a designed circuit pattern is manufactured. In Step 3 (manufacturing wafers), a wafer is manufactured with material such as silicon or the like. Step 4 (wafer process) is referred to as pre-process, in which actual circuits are formed on a wafer using a mask and a wafer with lithography techniques according to the present invention. Step 5 (assembling) is referred to as post-processing (a process for making the wafer manufactured in Step 4 into semiconductor chips) and includes an assembly process (dicing and bonding), a packaging process (enclosing chips), and so forth. In Step 6 (inspection), the semiconductor devices manufactured in Step 5 are subjected to inspection such as movement confirmation tests, durability tests, and the like. The semiconductor devices are completed by the foregoing processes, and shipped (Step 7).

Figure 17:
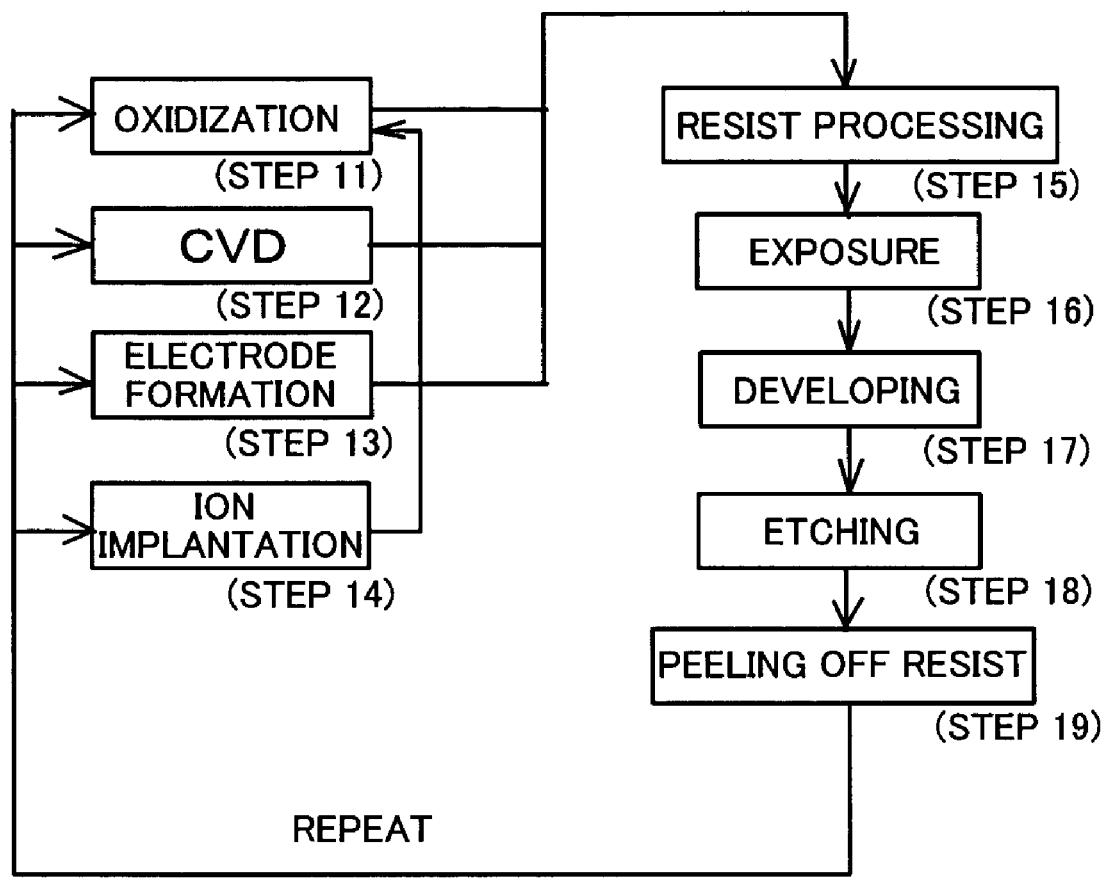
FIG. 17 is a detailed flowchart of the wafer process in Step 4 shown in FIG. 16.

FIG. 17 is a detailed flowchart of the wafer process in Step 4. In Step 11 (oxidization), the surface of a wafer is oxidized. In Step 12 (CVD), an insulating film is formed on the surface of a wafer. In Step 13 (electrode formation), electrodes are formed on a wafer by vapor deposition. In Step 14 (ion implantation), ions are implanted on a wafer. In Step 15 (resist process), a photosensitive agent is coated on the wafer. In Step 16 (exposure), the circuit pattern of the mask is exposed on a wafer with the foregoing exposure apparatus 300. In Step 17 (developing), the exposed wafer is developed. In Step 18 (etching), other parts excluding the developed resist image are trimmed. In Step 19 (peeling off the resist), unnecessary resist following etching is removed. Repeating the foregoing steps forms multiple circuit patterns on a wafer. According to the device manufacturing method of the present embodiment, high-quality devices can be manufactured as compared with conventional devices.

While the preferred embodiments of the present invention have been described, it is needless to say that the present invention is not restricted to these embodiments, and that various adaptations and modifications may be made without departing from the spirit and scope of the invention. For example, while the mask according to the present embodiment is a binary mask, a halftone mask may be employed. Note that a halftone mask is a mask that is modified so that light intensity on portions corresponding to light-shielding portions of a binary mask is attenuated, and also phase difference as to light-transmitting portions keeps 180°. Alternatively, a so-called phase shift mask is applicable so as to provide a phase difference of 180° on adjacent light passing through openings.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A mask manufacturing method suitable for an exposure method wherein a mask on which a contact hole pattern and a supplementary hole pattern with formations smaller than those of the contact hole pattern are arrayed is illuminated, and the light which passed through the mask onto a member to be exposed is projected via a projection optical system, said method comprising:

a selecting step for selecting one of a normal array and an offset array as an array of the supplementary hole pattern based on a pitch of the contact hole pattern, a wavelength of the light, and a numerical aperture of the projection optical system; and a forming step for forming the contact hole pattern and the supplementary hole pattern on the mask so as to form the supplementary hole pattern selected in the selecting step, wherein the normal array is an array where a line extending in the vertical direction as to the pitch direction from a predetermined contact hole of said contact hole pattern, and a line connecting a predetermined supplementary hole closest to said predetermined contact hole of the supplementary hole pattern and the predetermined contact hole intersect at an angle of 0°, and wherein the offset array is an array where said angle is 0° or more but less than 45°.

2. A mask manufacturing method according to claim 1, wherein said selecting step selects one of the normal array and the offset array as the array of the supplementary hole pattern based on $k_1$ in the case of converting a half pitch of said contact hole pattern with $k_1$ which is represented by the Expression $$k_1 = HP(NA/\lambda)$$

wherein HP denotes a half pitch of said contact hole pattern, $\lambda$ denotes a wavelength of said light, and NA denotes numerical aperture of said projection optical system.

3. A mask manufacturing method according to claim 2, wherein said selecting step selects the normal array in the case of $k_1$ being between 0.25 and 0.32.

4. A mask manufacturing method according to claim 2, wherein said selecting step selects the offset array in the case of $k_1$ being between 0.35 and 0.38.

5. A mask designing method suitable for an exposure method wherein a mask on which a contact hole pattern and a supplementary hole pattern with formations smaller than those of the contact hole pattern are arrayed is illuminated, and the light which passed through the mask onto a member to be exposed is projected via a projection optical system, said method comprising:

a selecting step for selecting one of a normal array and an offset array as an array of the supplementary hole pattern based on a pitch of the contact hole pattern, a wavelenth of the light, and a numerical aperture of the projection optical system, wherein the normal array is an array where a line extending in the vertical direction as to the pitch direction from a predetermined contact hole of said contact hole pattern, and a line connecting a predetermined supplementary hole closest to said predetermined contact hole of the supplementary hole pattern and the predetermined contact hole intersect at an angle of 0°, and wherein the offset array is an array where said angle is 0° or more but less than 45°.

6. A program for executing any one of the designing methods according to claim 5.

7. An exposure method for exposing a member to be exposed with a contact hole pattern by illuminating a mask manufactured by said manufacturing method according to claim 1 so that said contact hole pattern is resolved and said supplementary hole pattern is prevented from being resolved, and projecting the light passing through said mask onto said member to be exposed via a projection optical system.

* * * * *

UNITED STATES PATENT AND TRADEMARK OFFICE
CERTIFICATE OF CORRECTION

| | | |
|---|---|---|
| PATENT NO. | : 7,399,558 B2 | Page 1 of 1 |
| APPLICATION NO. | : 10/896538 | |
| DATED | : July 15, 2008 | |
| INVENTOR(S) | : Kenji Yamazoe and Kenji Saitoh | |

It is certified that error appears in the above-identified patent and that said Letters Patent is hereby corrected as shown below:

ON THE TITLE PAGE:

On the title page, lines 15-19 Abstract should read

--angle of 0°, a second supplementary pattern wherein said supplementary pattern is disposed at a position where said angle is 0° or more but less than 45°, and a third supplementary pattern wherein said supplementary pattern is disposed at a position where said angle is 45°.-- instead of

"angle of 0°, a second supplementary pattern wherein said angle is 0° or more but less than 45°, and a third supplementary pattern wherein said supplementary pattern supplementary pattern is disposed at a position where said is disposed at a position whewre said angle is 45°.."

IN THE SPECIFICATION:

Column 2, line 49, "smaller. than" should read --smaller than--.

Column 3, lines 5-6, "a line. connecting" should read --a line connecting--.

IN THE CLAIMS:

Column 16, claim 5, line 44, "wavelenth" should read --wavelength--.

Signed and Sealed this

Fourth Day of November, 2008

JON W. DUDAS
*Director of the United States Patent and Trademark Office*